United States Patent
Pasad et al.

(10) Patent No.: US 12,327,082 B2
(45) Date of Patent: Jun. 10, 2025

(54) METHODS AND APPARATUS FOR COMPRESSING DATA STREAMS

(71) Applicant: Marvell Asia Pte, Ltd., Singapore (SG)

(72) Inventors: Kalpendu Ratanshi Pasad, Cupertino, CA (US); Hong Jik Kim, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/735,068

(22) Filed: May 2, 2022

(65) Prior Publication Data
US 2022/0261541 A1 Aug. 18, 2022

Related U.S. Application Data

(63) Continuation of application No. 16/861,033, filed on Apr. 28, 2020, now Pat. No. 11,347,941.
(Continued)

(51) Int. Cl.
*G06F 40/216* (2020.01)
*G06F 16/45* (2019.01)
(Continued)

(52) U.S. Cl.
CPC ............ *G06F 40/216* (2020.01); *G06F 16/45* (2019.01); *G06F 40/106* (2020.01); *G06F 40/146* (2020.01)

(58) Field of Classification Search
CPC ...... G06F 16/45; G06F 40/106; G06F 40/146; G06F 40/216; H03M 7/4062
See application file for complete search history.

(56) References Cited

U.S. PATENT DOCUMENTS

| | | | |
|---|---|---|---|
| 6,188,795 B1 * | 2/2001 | Brady | G06T 9/005 |
| | | | 341/107 |
| 6,256,608 B1 * | 7/2001 | Malvar | G10L 19/0212 |
| | | | 704/E19.02 |

(Continued)

FOREIGN PATENT DOCUMENTS

WO WO-2013128010 A2 * 9/2013 ............... G06T 9/00

OTHER PUBLICATIONS

"Relay Using Differential Coding and Hoffman Coding and Method", published on Feb. 27, 2015, Document ID: KR-101496827-B1, pp. 7 (Year: 2015).*

(Continued)

*Primary Examiner* — Chau T Nguyen
(74) *Attorney, Agent, or Firm* — JW Law Group; James M. Wu

(57) ABSTRACT

Methods and apparatus for compressing data streams. In an embodiment, a method includes calculating a decomposition of matrix data to generate eigenvectors and associated eigenvalues, determining clusters of the eigenvectors based on weighting the eigenvalues, calculating an eigenvector centroid for each cluster so that a dictionary of centroids is generated, and tagging the eigenvectors with tags, respectively, that identify an associated eigenvector centroid for each eigenvector. The method also includes counting a number of eigenvectors associated with each eigenvector centroid to construct a probability distribution function (PDF) of centroids, matching the PDF of centroids to PDF templates to determine a closest matching PDF template, determining an encoder corresponding to the closest matching PDF template wherein a corresponding encoder identifier is identified, encoding the tags with the encoder to generate an encoded data stream, and transmitting the
(Continued)

encoded data stream, the encoder identifier, the dictionary of centroids, and the eigenvalues.

31 Claims, 12 Drawing Sheets

Related U.S. Application Data

(60) Provisional application No. 62/841,207, filed on Apr. 30, 2019, provisional application No. 62/841,202, filed on Apr. 30, 2019.

(51) Int. Cl.
*G06F 40/106* (2020.01)
*G06F 40/146* (2020.01)

(56) References Cited

U.S. PATENT DOCUMENTS

| | | | |
|---|---|---|---|
| 8,311,334 B2* | 11/2012 | Guleryuz | G06V 10/7715 |
| | | | 382/242 |
| 9,239,777 B1 | 1/2016 | Cohen | |
| 10,671,697 B1 | 6/2020 | Batruni | |
| 10,798,399 B1 | 10/2020 | Wei | |
| 2004/0202374 A1* | 10/2004 | Venkataraman | H04N 19/13 |
| | | | 348/222.1 |
| 2009/0222472 A1 | 9/2009 | Aggarwal | |
| 2013/0297575 A1* | 11/2013 | Fallon | H03M 7/4043 |
| | | | 707/693 |
| 2014/0321764 A1* | 10/2014 | Zarom | H04N 19/593 |
| | | | 382/243 |
| 2016/0142937 A1 | 5/2016 | Balasubramanian | |
| 2017/0214928 A1 | 7/2017 | Cook | |
| 2018/0240470 A1 | 8/2018 | Wang | |
| 2020/0162100 A1 | 5/2020 | Beckman | |
| 2020/0169268 A1 | 5/2020 | Billa | |

OTHER PUBLICATIONS

Yong G and Lixin Z, "The Scribing Mark Character Identifying Method and Device", published on Jul. 23, 2008, Document ID: CN 100405389 C, pp. 7. (Year: 2008).*

* cited by examiner

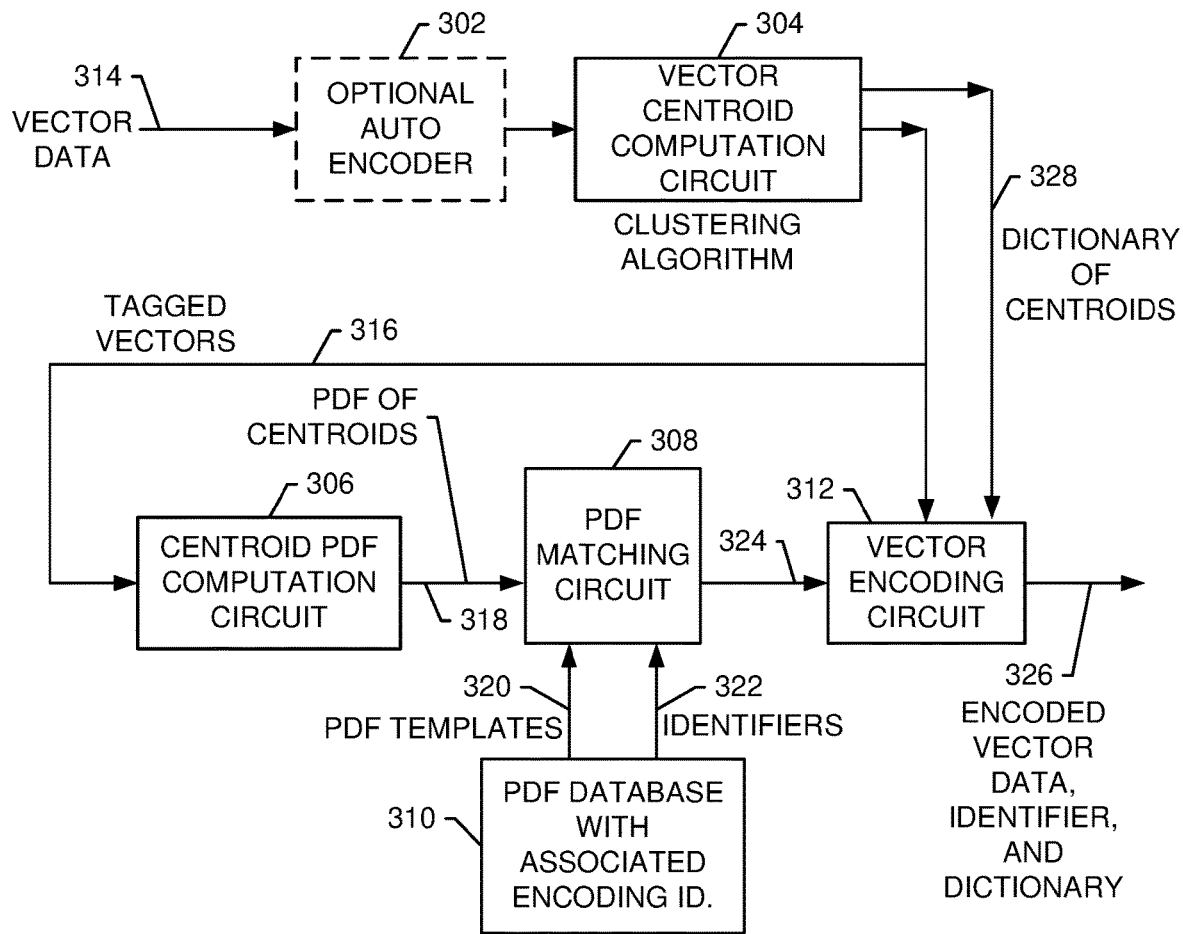

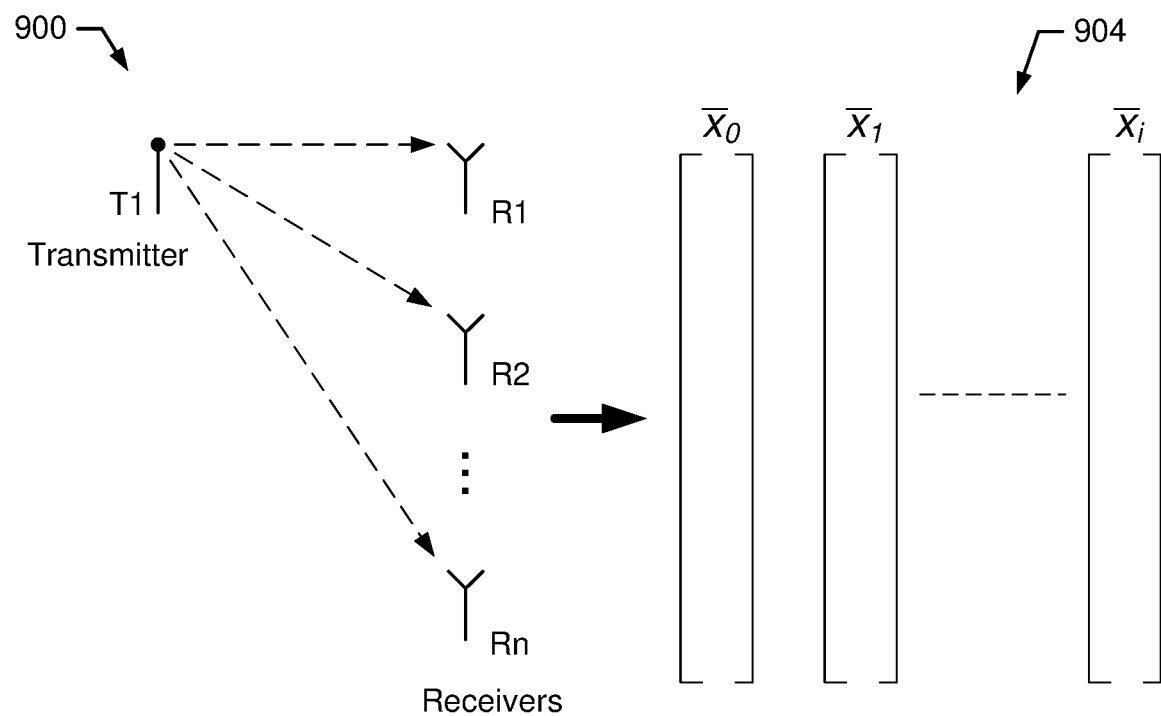
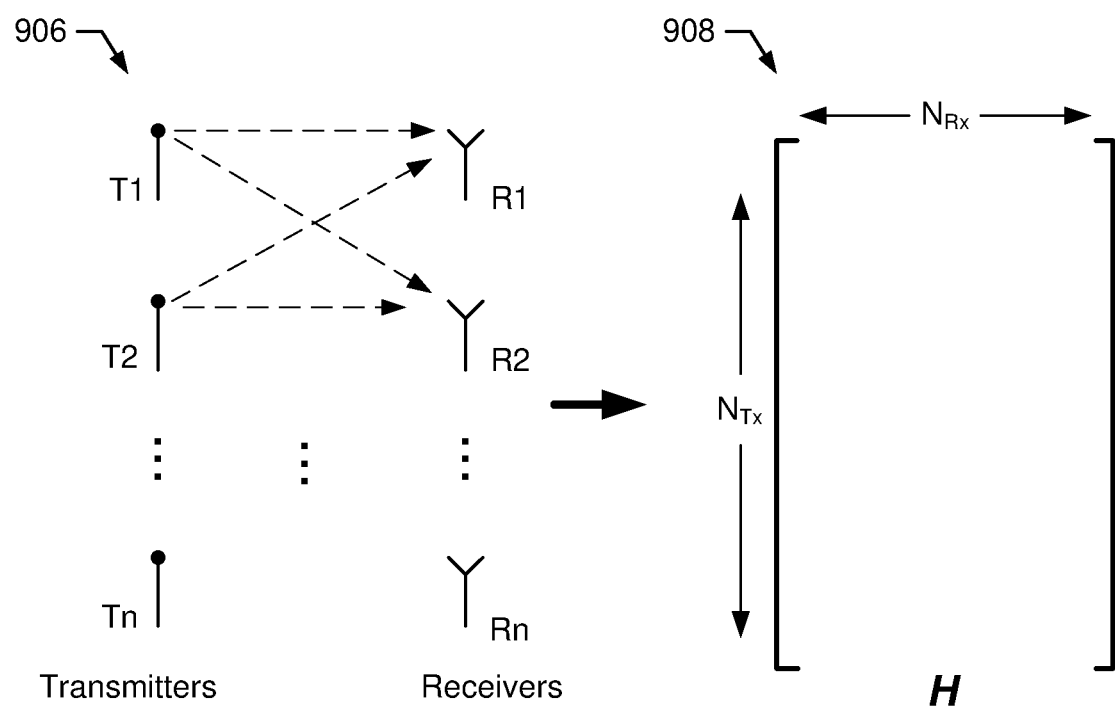
FIG. 9A

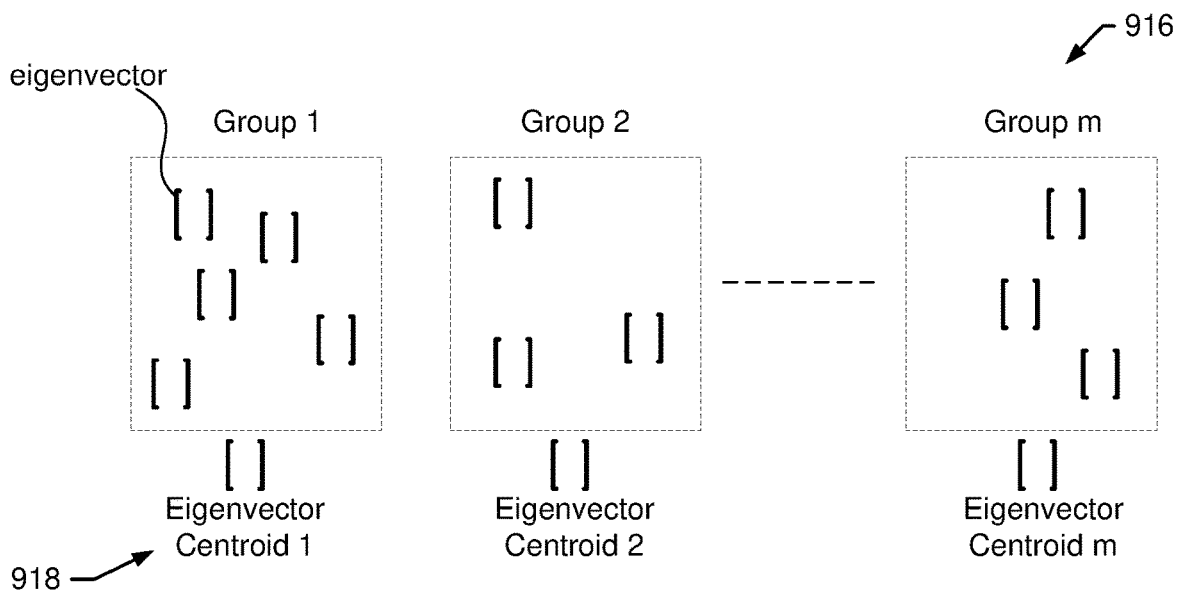
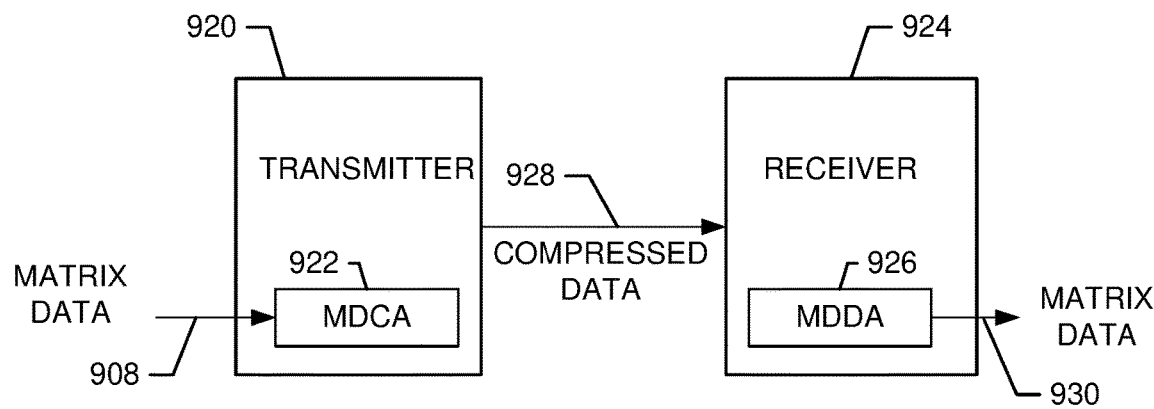
FIG. 9B

MATRIX COMPRESSION

MATRIX DECOMPRESSION

APPARATUS FOR MATRIX COMPRESSION

APPARATUS FOR MATRIX DECOMPRESSION

METHODS AND APPARATUS FOR COMPRESSING DATA STREAMS

PRIORITY

This patent application is a continuation patent application of a U.S. patent application having a U.S. patent application Ser. No. 16/861,033, filed on Apr. 28, 2020 in the name of the same inventor and entitled "Methods and Apparatus for Compressing Data Stream," issued with a Patent No. 11,347,941 on May 31, 2022, which also claims the benefit of priority from U.S. Provisional Application No. 62/841,207, filed on Apr. 30, 2019, and entitled "Method and Apparatus for Compressing Incoming Data Stream via Probability Distribution Functions (PDF) and U.S. Provisional Application No. 62/841,202, filed on Apr. 30, 2019, and entitled "Method and Apparatus for Compressing Incoming Data Stream Using A Compression Engine for A Hardware Accelerator Block," all of which are hereby incorporated herein by reference in their entirety.

CROSS-REFERENCE TO RELATED APPLICATIONS

The present application contains subject matter that may be related to the subject matter in U.S. application Ser. No. 17/735,063 entitled "Methods and Apparatus for Compressing Data Streams", filed on May 2, 2022 in the name of same inventor(s).

FIELD

The exemplary embodiments of the present invention relate to data transmission. More specifically, the exemplary embodiments of the present invention relate to compressing and decompressing data streams for data transmission.

BACKGROUND

With the rapidly growing trend of mobile and remote data access over high-speed communication networks, such as LTE or 5G cellular services, accurately delivering and deciphering data streams has become increasingly challenging and difficult. High-speed communication networks, which are capable of delivering information include, but are not limited to, wireless networks, cellular networks, wireless personal area network ("WPAN"), wireless local area networks ("WLAN"), or wireless metropolitan area networks ("WMAN").

The problems and concerns of data transmission are not restricted to data transmission over wired or wireless system interconnects, but even extend to the transmission of data over interconnects between circuitry on one integrated circuit or system-on-chip (SoC) device. As data rates increase and the volume of data that flows over system interconnects increases, systems to efficiently transmit data are becoming increasing important.

Therefore, it is desirable to have a mechanism that can be used to efficiently transmit data over system interconnects.

SUMMARY

In various embodiments, methods and apparatus are provided for compressing and decompressing data for transmission over system interconnects. For example, a data compression accelerator ("DCA") is provided that implements data compression to reduce traffic over system interconnects. The methods and apparatus can also be used to compress data for transmission over wired or wireless connections. At a receiver that receives the compressed data, an identifier is received with the compressed data that is used to identify a type of decompression to be used to recover the original data. Thus, efficient data transmission over system interconnects is achieved.

In one embodiment, the data compression accelerator is capable of processing and compressing incoming information to be transmitted over a wireless communications network. Upon receiving an information stream, a probability distribution function ("PDF") associated with the information stream is computed. After matching the PDF to a set of predefined PDFs (templates) stored in a local memory, a closest matching PDF is selected from the set of predefined PDFs. In one aspect, an encoder associated with the closest matching PDF is used to compress (encode) the information stream. The encoded stream and an identifier identifying the encoder are transmitted to a receiving circuit or device. The receiving circuit or device uses the encoder identifier to identify a decoder to be used to decompress the encoded stream.

In an embodiment, a method is provided for encoding information. The method includes calculating a probability distribution function (PDF) for scaler data, matching the PDF to PDF templates to determine a closest matching PDF template, and determining an encoder corresponding to the closest matching PDF template, such that a corresponding encoder identifier is determined. The method also includes encoding the scaler data with the encoder to generate an encoded stream, and transmitting the encoded stream and the encoder identifier. In an aspect, the encoder is an entropic encoder that provides lossless data compression. For example, one type of entropic encoder creates and assigns a unique prefix-free code to each unique symbol that occurs in the input. Then, the data is compressed by replacing each fixed-length input symbol with the corresponding variable-length prefix-free output codeword. The length of each codeword is approximately proportional to the negative logarithm of the probability. Therefore, the most common symbols use the shortest codes.

In an embodiment, a method is provided for encoding vector information. The method comprises binning received vector data into a plurality of bins, determining a centroid for each bin, forming a dictionary of centroids, counting data vectors in each bin to construct a probability distribution function (PDF) of centroids, and matching the PDF of centroids to PDF templates to determine a closest matching PDF template. The method also comprises determining an encoder corresponding to the closest matching PDF template such that a corresponding encoder identifier is identified, quantizing vectors to the centroids using vector tags, encoding vector tags with the encoder to generate an encoded data stream, and transmitting the encoded stream, the encoder identifier, and the dictionary. In an aspect, the encoder is an entropic encoder that provides lossless data compression.

In an embodiment, an apparatus for encoding information is provided that comprises a probability distribution function (PDF) computation circuit that calculates a PDF associated with input data, a matching circuit that matches the PDF to PDF templates to determine a closest matching PDF template, and determines an encoder corresponding to the closest matching PDF template wherein a corresponding encoder identifier is determined. The apparatus also comprises an encoding circuit that encodes input data with the encoder to generate an encoded stream, and transmits the encoded stream and the encoder identifier.

In an embodiment, a method for compressing matrix data includes calculating a decomposition of the matrix data to generate eigenvectors and associated eigenvalues, determining clusters of the eigenvectors based on weighting the eigenvalues, calculating an eigenvector centroid for each cluster so that a dictionary of centroids is generated, and tagging the eigenvectors with tags, respectively, that identify an associated eigenvector centroid for each eigenvector. The method also includes counting a number of eigenvectors associated with each eigenvector centroid to construct a probability distribution function (PDF) of centroids, matching the PDF of centroids to PDF templates to determine a closest matching PDF template, determining an encoder corresponding to the closest matching PDF template wherein a corresponding encoder identifier is identified, encoding the tags with the encoder to generate an encoded data stream, and transmitting the encoded data stream, the encoder identifier, the dictionary of centroids, and the eigenvalues.

In an embodiment, a method is provided for decompressing matrix data. The method includes receiving an encoded data stream, encoder identifier, dictionary of centroids, and eigenvalues, determining a decoder based on the encoder identifier, and decoding the encoded data stream using the decoder to obtain tags. The method also includes converting the tags into a sequence of centroids using the dictionary and recomposing the matrix data from the sequence of centroids and the eigenvalues.

Additional features and benefits of the exemplary embodiments of the present invention will become apparent from the detailed description, figures, and claims set forth below.

BRIEF DESCRIPTION OF THE DRAWINGS

The exemplary aspects of the present invention will be understood more fully from the detailed description given below and from the accompanying drawings of various embodiments of the invention, which, however, should not be taken to limit the invention to the specific embodiments, but are for explanation and understanding only.

FIG. 3 shows an exemplary alternative embodiment of the data compression accelerator of FIG. 2 that is configured to encode vector data.

FIG. 4 shows an exemplary embodiment of PDF templates associated with scaler and vector data.

FIG. 9A shows an embodiment of a matrix that is compressed for efficient transmission in accordance with the invention.

FIG. 9B shows an embodiment of a transmitter that includes an exemplary embodiment of a matrix data compression accelerator and a receiver that includes an exemplary embodiment of a matrix data decompression accelerator that provide efficient transmission of matrix data over system interconnects.

DETAILED DESCRIPTION

Figure 1:
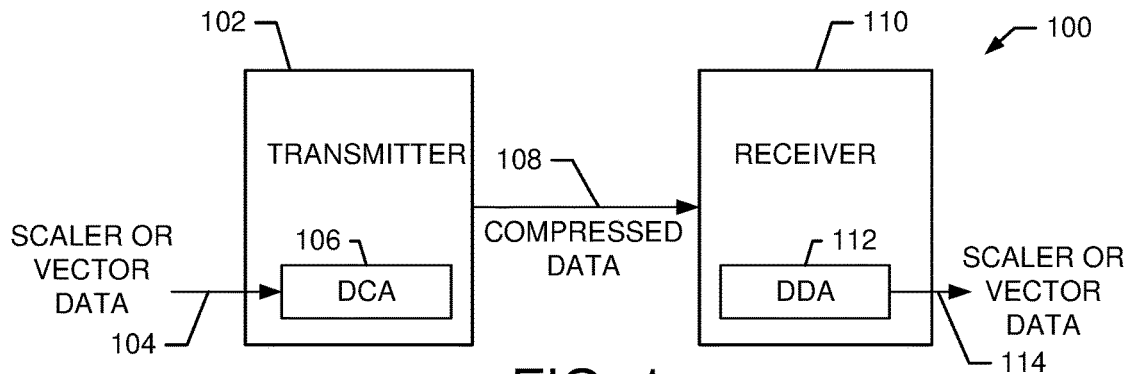
FIG. 1 shows a communication network having a transmitter that includes an exemplary embodiment of a data compression accelerator and a receiver that includes an exemplary embodiment of a data decompression accelerator that provide efficient transmission of scaler or vector data over system interconnects.

In various embodiments, methods and apparatus are provided for efficiently compressing and decompressing scalar or vector data streams. The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or descriptions.

In the interest of clarity, not all of the routine features of the implementations presented herein are shown and described. It will, of course, be understood that in the development of any such actual implementation, numerous implementation-specific decisions may be made in order to achieve the developer's specific goals, such as compliance with application and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiments of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, subsystems, devices, packet switch elements, packet switches, access switches, routers, networks, modems, base stations, cNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

FIG. 1 shows a communication network 100 having a transmitter 102 that includes an exemplary embodiment of a data compression accelerator (DCA) 106 and a receiver 110 that includes an exemplary embodiment of a data decompression accelerator (DDA) 112 that provide efficient data transmission of scaler or vector data over system interconnects.

In various exemplary embodiments, compression and decompression methods and apparatus described herein are extended to either scalar or vector data streams. This is particularly useful in (but not limited to) baseband modem applications (wireless and wireline) where data arrives from multiple antennas. Correlations in vectorized data offer a potential for a much higher degree of compression.

During operation, scaler or vector data 104 is received at the transmitter 102 for transmission to the receiver 110. The DCA 106 compresses the scaler or vector data 104 in accordance with embodiments of the invention to generate compressed data 108 that is transmitted to the receiver 110. The DDA 112 operates to reverse the processes performed at the DCA 106 to decompress the received compressed scaler or vector data 108 to recover the original data stream 114. Detailed descriptions of the design and operation of the DCA 106 and the DDA 112 are provided below.

Figure 2:
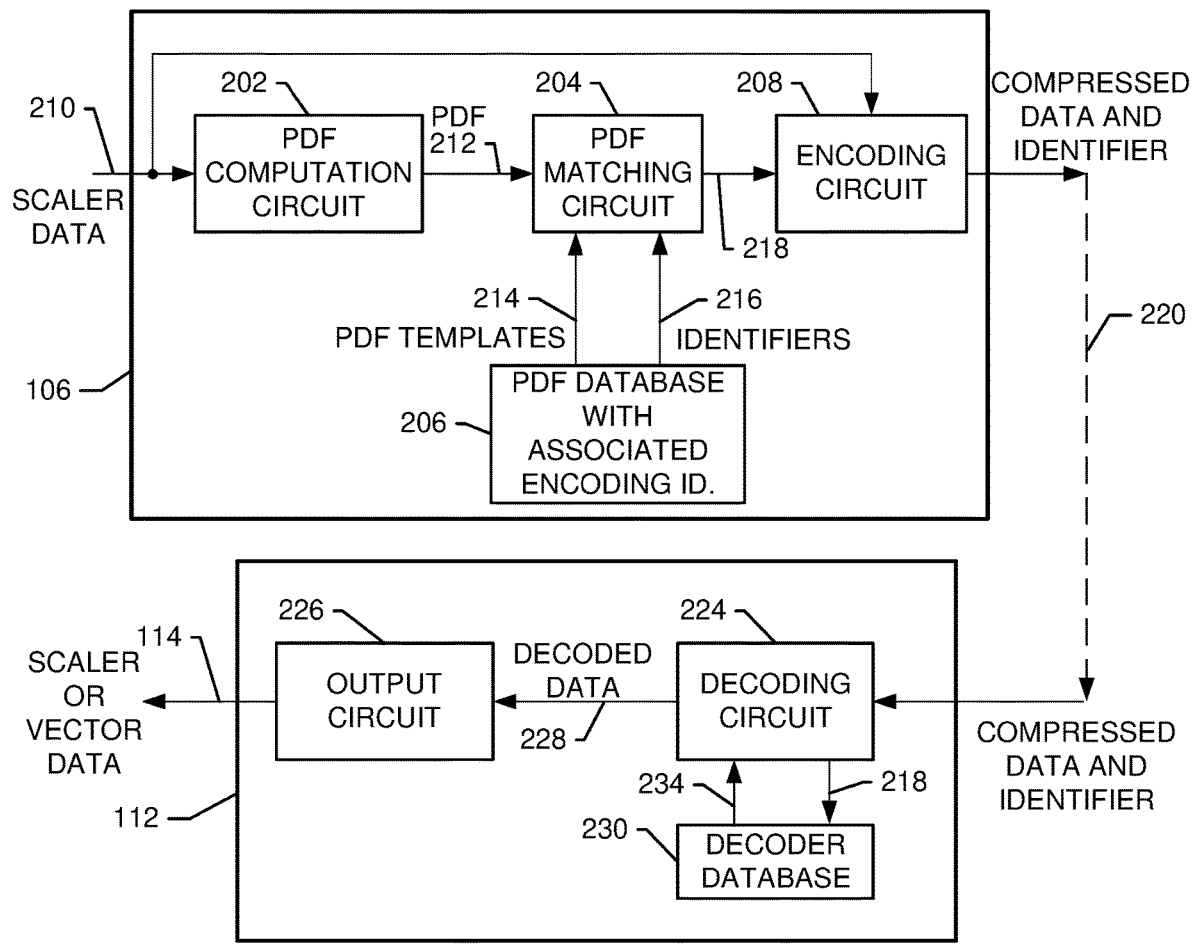
FIG. 2 shows exemplary detailed embodiments of the data compression accelerator and data decompression accelerator shown in FIG. 1.

FIG. 2 shows exemplary detailed embodiments of the DCA 106 and the DDA 112 shown in FIG. 1. The embodiments shown in FIG. 2 provide data compression, transmission, and decompression for scaler data. FIG. 3 illustrates embodiments that provide data compression for vector data. For simplicity the DDA 112 shown in FIG. 2 will be used to describe the receipt and decompression of both scaler and vector data.

Referring now to FIG. 2, the DCA 106 comprises PDF computation circuit 202, PDF matching circuit 204, PDF database 206, and encoding circuit 208. In an embodiment, the DDA 112 comprises decoding circuit 224, decoder database 230, and output circuit 226. Each of the functional blocks of the DCA 106 and the DDA 112 comprises hardware and algorithms that are selected to minimize latency and memory requirements. For example, the PDF computation circuit 202 may perform a simplified PDF computation by using partial and/or historical data.

During operation, the PDF computation circuit 202 receives scaler data 210 and calculates a probability distribution function 212 for the received scaler data 210. The PDF 212 is input to the PDF matching circuit 204. The PDF matching circuit 204 receives the PDF 212 and matches this PDF with PDF templates 214 that are stored in the PDF database 206. The PDF templates 214 are associated with encoding identifiers 216. In an embodiment, the encoding identifiers 216 associate a-specific entropic encoder for the selected PDF template. The PDF matching circuit 204 determines one of the PDF templates 214 that best matches the computed PDF 212. Determining the best matching can be done using any desired criteria and with respect to the specific implementation. Once the best matching PDF template is found, the encoding identifier 218 associated with the best matching PDF template is passed to the encoding circuit 208.

The encoding circuit 208 receives the scaler data 210 and applies the type of encoding identified by the encoding identifier 218 to generate compressed data. For example, the encoding circuit 208 uses entropic coding, such as Huffman coding. The combination 220, which includes the compressed (or encoded) data and the identifier 218, is then transmitted to the receiving circuit that includes the DDA 112. For example, the transmission may be a wired or wireless transmission.

In an embodiment, the DDA 112 receives the combination 220 of the compressed data and encoder identifier 218 at the decoding circuit 224. The decoding circuit 224 uses the identifier 218 to access the decoder database 230 to obtain a decoder 234 to be used to decompress the received compressed data. The decoder circuit 224 outputs decompressed (decoded) data 228 that is passed to the output circuit 226. The output circuit 226 performs any final processing and passes the recovered scaler or vector data 114 to other entities at the receiver.

In various exemplary embodiments, the disclosed methods and apparatus compress incoming data quickly before transmission to another processing block or device, and the compressed data can be subsequently decompressed quickly at that next processing block or device. In an aspect, the DCA 106 compresses scalar data for transmission by performing one or more of the following operations.

1. Calculating a probability distribution function (PDF) for the incoming scaler data.
2. Matching the calculated PDF to PDF templates stored in a database. For example, the matching may be performed using KL (Kullback-Leibler) divergence or other suitable function to determine the closest matching PDF template.
3. Selecting the closest matching PDF template.
4. Determining an encoder (such as an entropic encoder) associated with the closest matching PDF template. The best matching PDF template has an associated encoder identifier that is also stored in the database that identifies the entropic encoder.
5. Encoding the scaler data stream with the entropic encoder to generate an encoded data stream.
6. Transmitting the encoded data stream and encoder identifier to another processing block or device.
7. Receiving the encoded stream and encoder identifier at the processing block or device and decoding the encoded stream using a decoder identified by the encoder identifier.

FIG. 3 shows an exemplary alternative embodiment of a DCA 300 that is configured to compress vector data. The DCA 300 comprises an optional auto encoder 302, vector centroid computation circuit 304, centroid PDF computation circuit 306, PDF matching circuit 308, PDF template database 310, and vector encoding circuit 312.

During operation, vector data 314 is received at the optional auto encoder 302 or is passed directly to the vector centroid computation circuit 304. When processed by the auto-encoder 302, the vector data is reduced in dimension by an encoder portion of the auto-encoder 302. The auto-encoder is typically implemented as a pre-trained neural network that processes input vectors into lower dimensional vectors.

The vector centroid computation circuit 304 clusters (or bins) the vector data to determine centroids for the bins and tags the vectors with corresponding centroid identifiers to generate tagged vectors 316 that are passed to the centroid PDF computation circuit 306. For example, in an embodiment, the vector centroid computation circuit 304 utilizes a clustering algorithm to find clusters of vectors. Clustering is a method of vector quantization that partitions n observations into k clusters in which each observation belongs to the cluster with the nearest mean, serving as a prototype of the cluster. In an aspect, the clustering algorithm is a K-means clustering algorithm. The determined centroids are entered into a dictionary 328 that identifies each centroid and associates various parameters and values with each centroid. The dictionary of centroids 328 is passed to the vector encoding circuit 312.

The centroid PDF computation circuit 306 counts the number of vectors associated with each centroid to calculate a PDF of centroids 318. The PDF 318 is input to the PDF matching circuit 308. The PDF matching circuit 308 receives the PDF 318 and matches this PDF with PDF templates 320 that are stored in the PDF database 310. The PDF templates 320 are associated with encoding identifiers 322 that are also stored in the database 310. Each identifier identifies a type of entropic encoder associated with a particular PDF template. The PDF matching circuit 308 determines the PDF template that best matches the computed PDF 318 and passes the corresponding encoder identifier 324 to the vector encoding circuit 312. The vector encoding circuit 312 receives the tagged (or quantized) vectors 316 and applies the selected type of encoding identified by the encoding identifier 324 to compress the vector tags. The combination 326, which includes the compressed vector tag data, the encoder identifier 324, and the centroid dictionary 328 is then transmitted to a receiving block or device that includes a decompression circuit, such as the DDA 112. The decompression circuit decompresses the compressed data stream as described above, for example, as described with reference to FIG. 2.

In one aspect, the DCA 300 compresses vector data for transmission by performing one or more of the following operations.

1. Optionally applying an auto-encoder to vector data to reduce a dimension of the vector data and further facilitate the convergence of clustering.
2. Performing vector centroid computation to bin the vector data. For example, K-means clustering can be performed to determine the centroids for the bins. A centroid dictionary is formed from the determined centroids.
3. Tagging (or quantizing) each vector into its corresponding centroid.
4. Performing a centroid PDF computation to construct a PDF of centroids. For example, the number of vectors in each centroid are counted to construct a PDF of centroids.
5. Matching the PDF of centroids to PDF templates stored in a database. For example, the matching may be performed using KL (Kullback-Leibler) divergence or other suitable function.
6. Selecting the closest matching PDF template.
7. Determining an entropic encoder corresponding to the closest matching PDF template. For example, the entropic encoder has an associated encoder identifier that identifies the encoder.
8. Encoding the quantized vector tag data with the identified entropic encoder to generate and encoded data stream.
9 Transmitting the encoded data stream, encoder identifier, and the centroid dictionary to a receiver. For example, the transmission may be either a wired or wireless transmission.

FIG. 4 shows exemplary embodiments of scaler 402 and vector 404 PDF templates that are stored with associated encoder identifiers. For example, the scaler PDF templates are stored with scaler encoder identifiers ($SID_N$) and the vector PDF templates are stored with vector encoder identifiers ($VID_K$).

Figure 5:
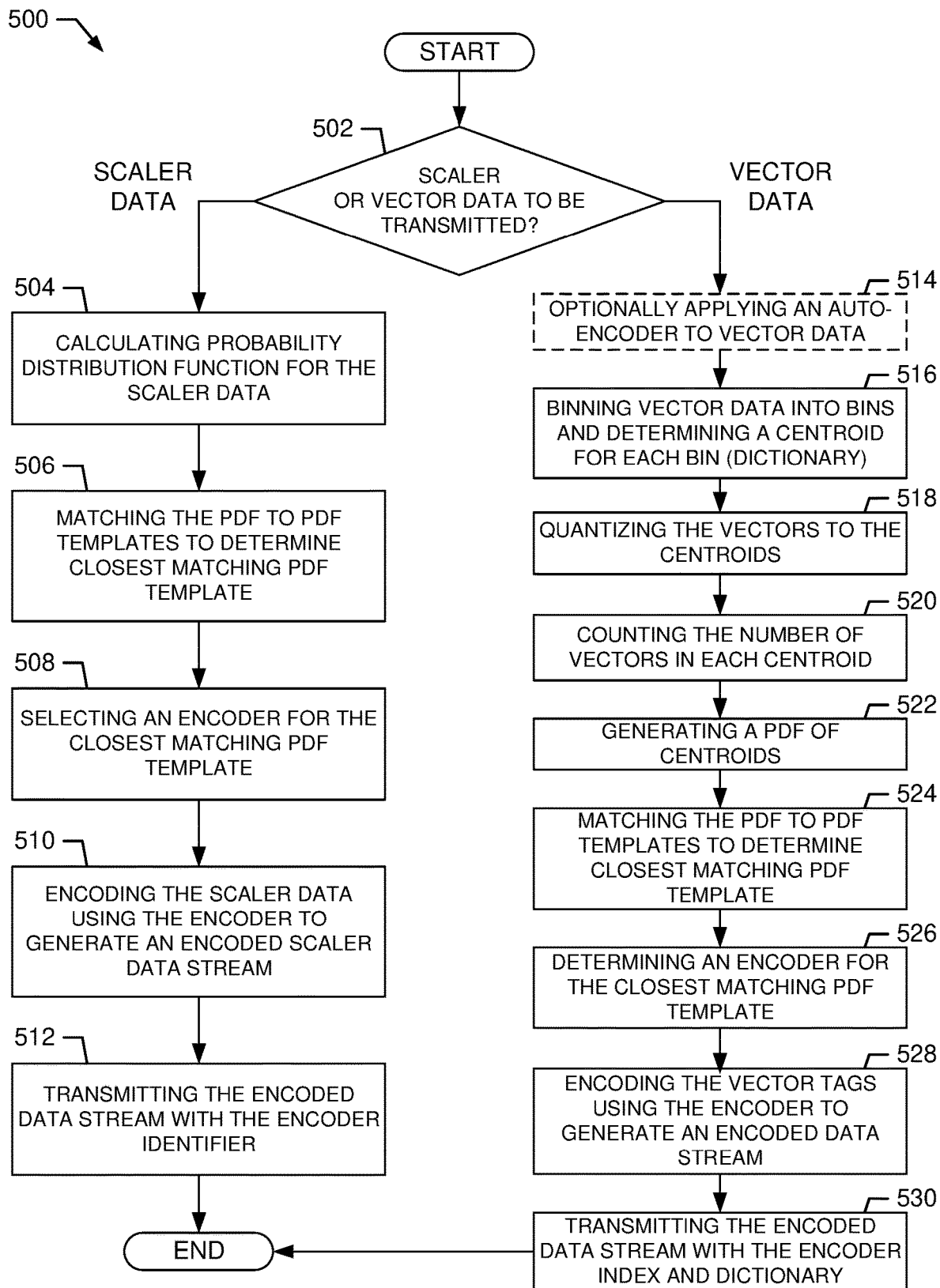
FIG. 5 shows an exemplary method for data compression of scaler or vector data to be transmitted over a system interconnect.

FIG. 5 shows an exemplary method 500 for data compression of scaler or vector data to be transmitted over a system interconnect. For example, the method 500 is suitable for use with the DCA 106 shown in FIG. 2 and the DCA 300 shown in FIG. 3.

At block 502, a determination is made as to whether data to be transmitted is scaler or vector. If the data is scaler data, the method proceeds to block 504. If the data is vector data, the method proceeds to block 514.

At block 504, a probability distribution function is calculated for the scaler data. For example, the PDF computation circuit 202 calculates the PDF 212 for received scaler data 210.

At block 506, the calculated PDF is matched with stored PDF templates to determine the closest matching PDF template. For example, the PDF matching circuit 204 matches the PDF 212 to PDF templates 214 stored in the database 206.

At block 508, an encoder associated with the closest matching PDF template is selected. In an embodiment, the encoder is an entropic encoder. For example, the PDF matching circuit 204 determines the closest matching PDF template and also determines an encoder identifier 218 associated and stored with the closest matching PDF template. The encoder identifier 218 is passed to the encoding circuit 208.

At block 510, the scaler data is compressed using the determined encoder. For example, the encoding circuit 208 compresses the scaler data 210 using the encoder identified by the encoder identifier 218.

At block 512, the encoded data is transmitted along with the encoder identifier. For example, the encoding circuit 208 transmits the combination 220, which comprises the encoded (compressed) data and the encoder identifier. After this operation, the method 500 ends.

At block 514, an auto-encoder is optionally applied to the vector data. The encoder portion of the auto-encoder reduces the dimension of the vector data. The auto-encoder can be implemented as a pre-trained neural network.

At block 516, the vector data is binned into bins and a centroid for each bin is determined. For example, the vector centroid computation circuit 304 performs these operations using a clustering algorithm to find the centroids for the bins. The determined centroids are maintained in a dictionary that identifies each centroid and associates various parameters and values with each centroid. For example, the vector centroid computation circuit 304 forms and maintains the dictionary of centroids 328.

At block 518, the vectors are quantized to the centroids. For example, the vector centroid computation circuit 304 quantizes the number of vectors in each centroid. For example, in an aspect, an operation of quantizing the vectors to the centroids is performed by representing the vector by the index (or tag) of the cluster to which the vector belongs.

At block 520, the number of vectors in each centroid are counted and output as tagged vectors 316 that are tagged with their associated centroid.

At block 522, a PDF of centroids is generated. For example, the vector PDF computation circuit 306 computes the PDF 318 from the tagged vectors 316.

At block 524, the computed PDF is matched to PDF templates to determine the closest matching PDF template. For example, the vector PDF matching circuit 308 matches the PDF 318 to the PDF templates stored in the database 310. A closest matching PDF template is determined.

At block 526, an encoder associated with the closest matching PDF template is determined. For example, the PDF matching circuit 308 retrieves an encoder identifier 324 associated with the closest matching PDF template that is stored in the database 310. The encoder identifier 324 identifies an encoder to be used to encode the vector data.

At block 528, the vector tags are encoded (compressed) using the determined encoder to generate an encoded data stream. For example, the vector encoding circuit 312 encodes the vector tags with the encoder identified by the encoder identifier 324 to generate the encoded data stream.

At block 530, the encoded data stream is transmitted along with the encoder identifier and the centroid dictionary as indicated at 326. The method then ends.

Thus, the method 500 operates to compress scaler or vector data to be transmitted over a system interconnect. It should be noted that the operations of the method 500 are exemplary and that changes, modifications, additions, and deletions may be made within the scope of the embodiments.

Figure 6:
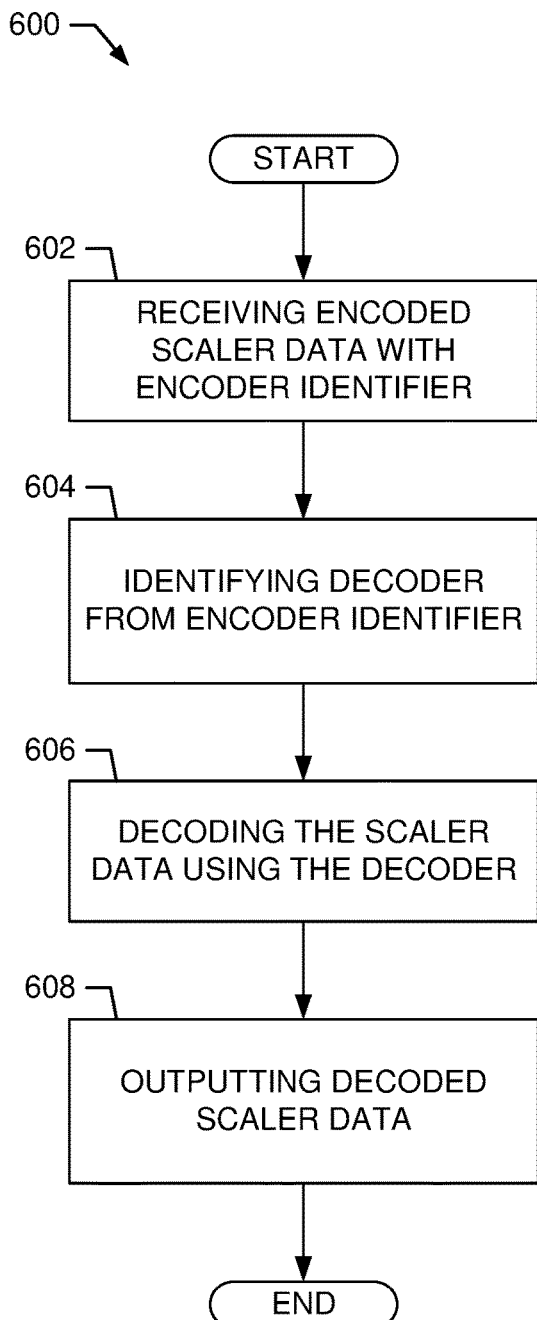
FIG. 6 shows an exemplary method for data decompression of scaler data received over a system interconnect.

FIG. 6 shows an exemplary method 600 for data decompression of scaler data received over a system interconnect. For example, the method 600 is suitable for use with the DDA 112 shown in FIG. 2.

At block 602, scaler data with a corresponding encoder identifier is received. For example, the scaler data and the encoder identifier are received by the decoding circuit 224.

At block 604, a decoder is identified using the encoder identifier. For example, the decoding circuit 224 uses the encoder identifier to access the stored decoders in decoder database 230 to obtain the decoder 234.

At block 606, the scaler data is decoded using the decoder. For example, the decoding circuit 224 decodes the received compressed scaler data using a decoder 234 identified by the encoder identifier.

At block 608, the decoded data is output. For example, the decoded data 228 is passed to the output circuit 226 which outputs the decoded data as the original scaler data 210.

Thus, the method 600 operates to decode received scaler data. It should be noted that the operations of the method 600 are exemplary and that changes, modifications, additions, and deletions may be made within the scope of the embodiments.

Figure 7:
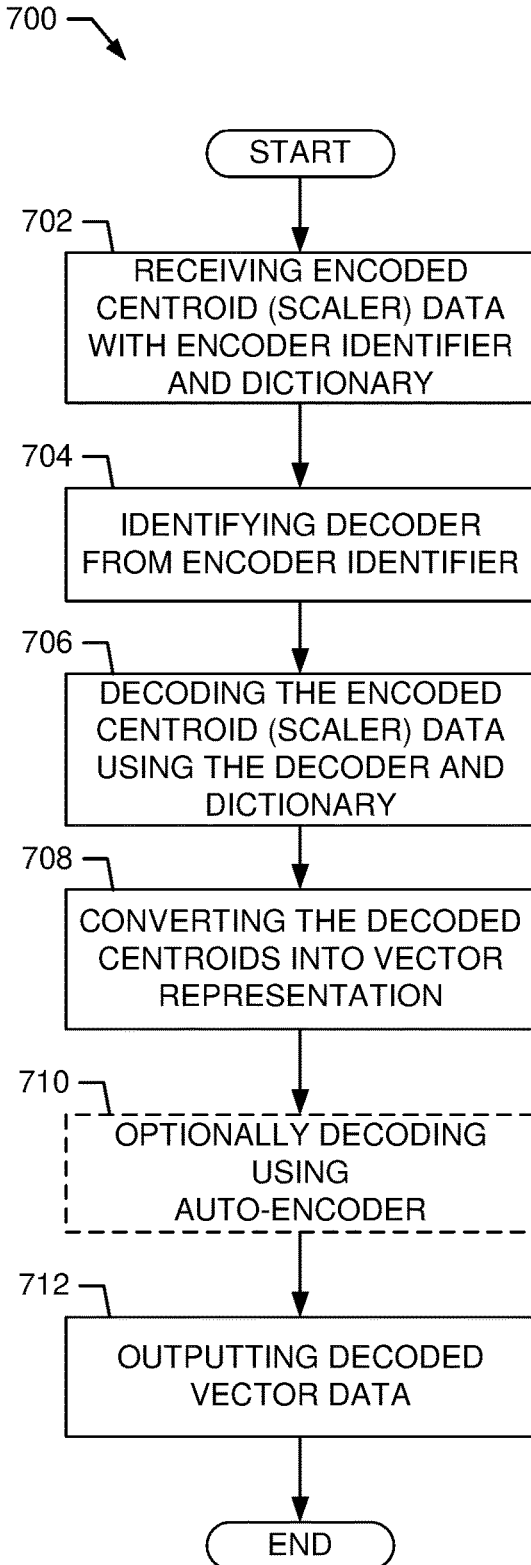
FIG. 7 shows an exemplary method for data decompression of vector data received over a system interconnect.

FIG. 7 shows an exemplary method 700 for data decompression of vector data received over a system interconnect. For example, the method 700 is suitable for use with the DDA 112 shown in FIG. 2.

At block 702, encoded centroid data with a corresponding encoder identifier and centroid dictionary is received. In an embodiment, the encoded data is in the form of scaler data. For example, the encoded centroid data and the encoder identifier are received by the decoding circuit 224.

At block 704, a decoder is determined using the encoder identifier. For example, the decoding circuit 224 uses the encoder identifier to access the stored decoders in decoder database 230 to determine the decoder 234.

At block 706, the encoded centroid data is decoded using the decoder. For example, the decoding circuit 224 decodes the received encoded centroid data using the received dictionary and the decoder 234 determined from the encoder identifier.

At block 708, the decoded centroids are converted into a vector representation. For example, the decoding circuit 224 converts the decoded centroids into a vector representation using the dictionary and the decoded vector tags.

At block 710, an optional operation is performed wherein the vector representation is decoded using a decoding part of an auto-encoder. The decoding part of the auto-encoder restores the dimensionality of the vector data. For example, the decoding circuit 224 performs this optional operation.

At block 712, the decoded vector data is output. For example, the decoded data 228 is passed to the output circuit 226, which outputs the decoded data as the original vector data 114.

Thus, the method 700 operates to decode received vector data. It should be noted that the operations of the method 700 are exemplary and that changes, modifications, additions, and deletions may be made within the scope of the embodiments.

Figure 8:
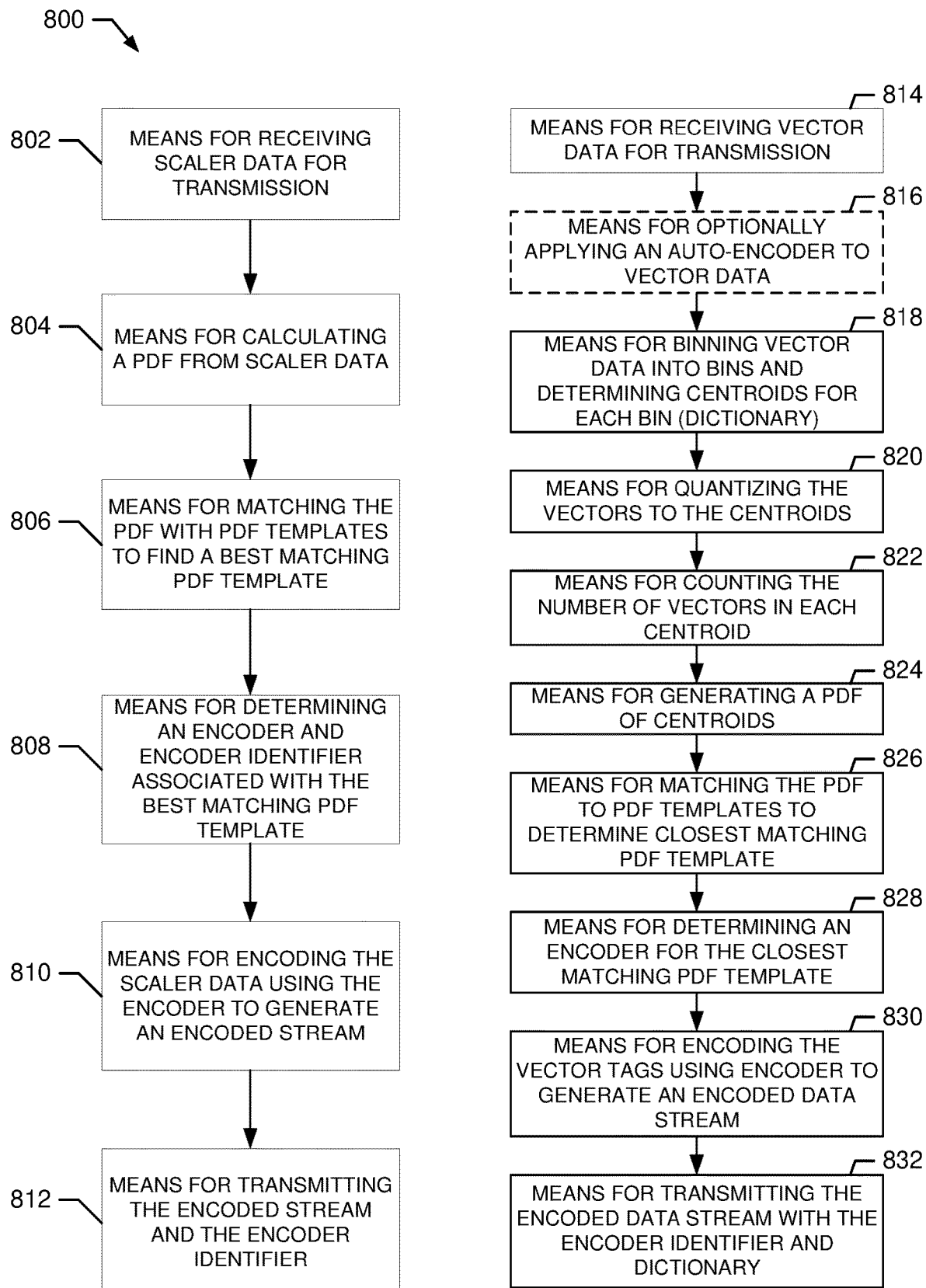
FIG. 8 shows an exemplary apparatus for compression of scaler or vector data.

FIG. 8 shows an exemplary apparatus 800 for data compression of scaler or vector data in accordance with exemplary embodiments of the invention.

The apparatus comprises means (802) for receiving scaler data for transmission, which in an embodiment comprises the PDF computation circuit 202. The apparatus also comprises means (804) for calculating a PDF from received scaler data, which in an embodiment comprises the PDF computation circuit 202. The apparatus also comprises means (806) for matching the PDF with PDF templates to find a best matching PDF template, which in an embodiment comprises the PDF matching circuit 204. The apparatus also comprises means (808) for determining an encoder and encoder identifier associated with the best matching PDF template, which in an embodiment comprises the PDF matching circuit 204. The apparatus also comprises means (810) for encoding the scaler data using the encoder to generate an encoded stream, which in an embodiment comprises the encoding circuit 208. The apparatus also comprises means (812) for transmitting the encoded stream and the encoder identifier, which in an embodiment comprises the encoding circuit 208.

In an embodiment, the apparatus also comprises means (814) for receiving vector data for transmission, which in an embodiment comprises the vector centroid computation circuit 304. The apparatus also comprises means (816) for optionally applying an auto-encoder to the vector data, which in an embodiment comprises the auto-encoder 302. The apparatus also comprises means (818) for binning vector data into bins and determining centroids for each bin and a centroid dictionary, which in an embodiment comprises the vector centroid computation circuit 304. The apparatus also comprises means (820) for quantizing the vectors to the centroids, which in an embodiment comprises the vector centroid computation circuit 304. The apparatus also comprises means (822) for counting the number of vectors in each centroid, which in an embodiment comprises the vector centroid computation circuit 304. The apparatus also comprises means (822) for generating a PDF of centroids, which in an embodiment comprises the vector PDF computation circuit 306. The apparatus also comprises means (824) for matching the PDF to PDF templates to determine a closest matching PDF template, which in an embodiment comprises the PDF matching circuit 308. The apparatus also comprises means (826) for determining an encoder associated with the closest matching PDF template, which in an embodiment comprises the PDF matching circuit 308. The apparatus also comprises means (830) for encoding the vector tags using an encoder to generate an encoded data stream, which in an embodiment comprises the vector encoding circuit 312. The apparatus also comprises means (832) for transmitting the encoded data stream with the encoder identifier and the centroid dictionary, which in an embodiment comprises the vector encoding circuit 312.

FIG. 9A shows an embodiment of a matrix 908 to be compressed for efficient transmission in accordance with the invention. As indicated at indicator 900, a single transmitter (T1) transmits information to a plurality of receivers (R1-

Rn). A plurality of receive vectors 904 are obtained. In various embodiments, the receive vectors 904 can be compressed for efficient transmission using the vector compression embodiments described above.

As indicated at 906, a plurality of transmitters (T1-Tn) transmit information to a plurality of receivers (R1-Rn). A receive matrix 908 is obtained. In various embodiments, the receive matrix 908 can be compressed for efficient transmission using the matrix compression embodiments described below.

FIG. 9B shows an embodiment of a transmitter 920 that includes an exemplary embodiment of a matrix data compression accelerator (MDCA) 922 and a receiver 924 that includes an exemplary embodiment of a matrix data decompression accelerator (MDDA) 926 that provide efficient transmission of matrix data over system interconnects.

As illustrated in FIG. 9B, the MDCA 922 operates to decompose the matrix data 908 into a matrix of eigenvectors 910, eigenvalues 912, and an inverse of the eigenvectors 914. Once this decomposition is complete, the eigenvectors 910 can be grouped into groups 916. For example, the eigenvectors 910 are shown grouped into m groups. In an exemplary embodiment, weighted eigenvalues are used to determine how the eigenvectors are assigned to each group.

Once the grouping is complete, eigenvector centroids 918 are calculated for each group. For example, m eigenvector centroids 918 are calculated for the m groups 916. Each eigenvector in each group is then tagged with an indicator that indicates the centroid for the group in which the eigenvector belongs. A dictionary of the eigenvector centroids is also maintained and stored in a memory. The MDCA 922 determines an encoder to best compress the eigenvector tags. The compressed tags, an encoder identifier, the dictionary, and the eigenvalues are then transmitted as the compressed data 928.

At the receiver 924, the MDDA 926 operates to receive the encoded data stream, the encoder identifier, the dictionary, and the eigenvalues. The encoder identifier is used to identify a decoder to decode the data stream to obtain the vector tags. The vector tags and the dictionary are processed to generate a sequence of centroids that represent the original matrix data. Finally, the sequence of centroids and the eigenvalues are used to recompose the matrix data 930.

Figure 10:
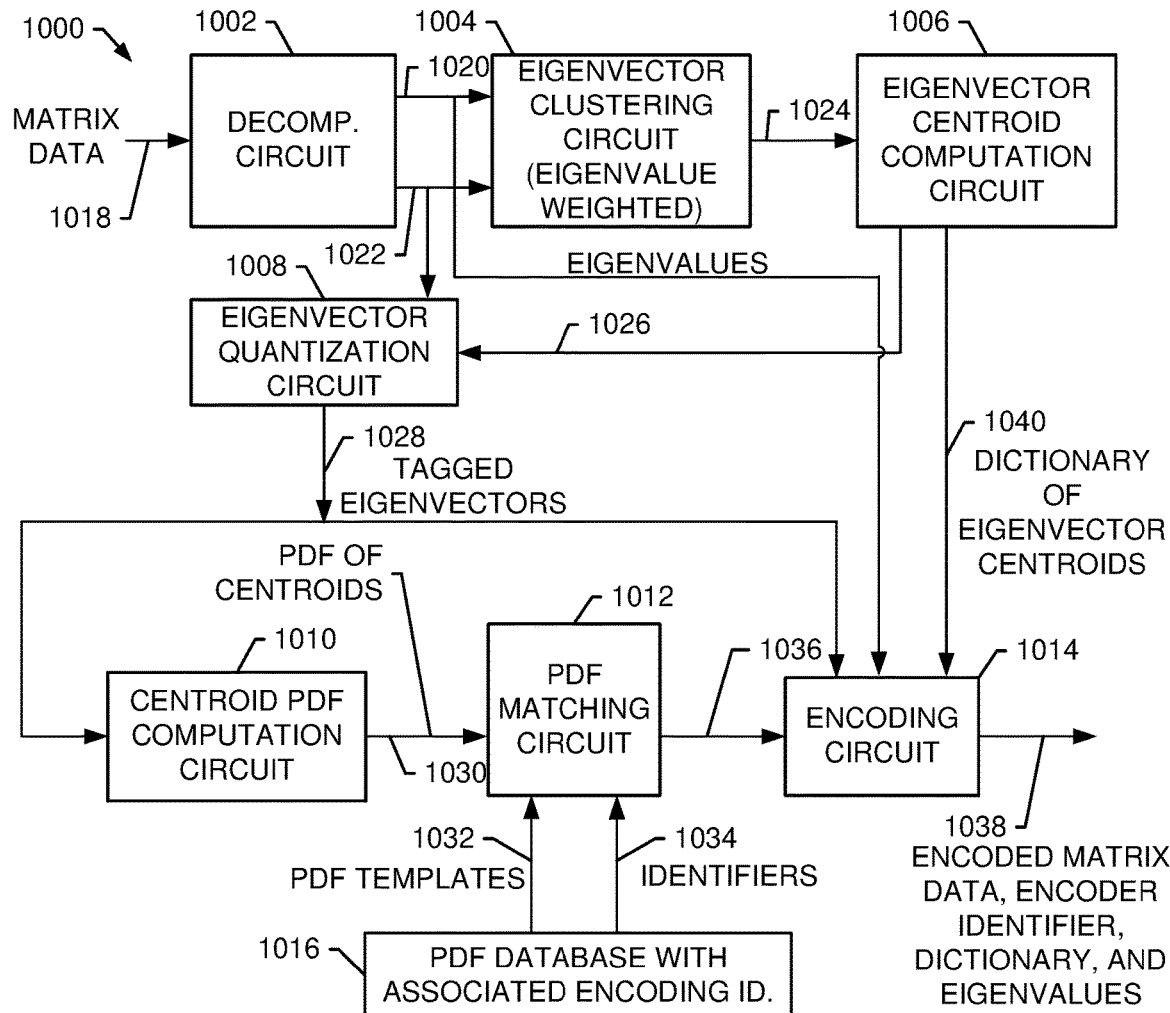
FIG. 10 shows an exemplary detailed embodiment of a matrix data compression accelerator that is configured to compress matrix data.

FIG. 10 shows an exemplary detailed embodiment of a matrix data compression accelerator (MDCA) 1000 that is configured to compress matrix data. For example, the MDCA 1000 is suitable for use at the MDCA 922 shown in FIG. 9B. The MDCA 1000 comprises decomposition circuit 1002, eigenvector clustering circuit 1004, eigenvector centroid computation circuit 1006, eigenvector quantization circuit 1008, centroid PDF computation circuit 1010, PDF matching circuit 1012, PDF template database 1016, and encoding circuit 1014.

During operation, matrix data 1018 is received at the matrix decomposition circuit 1002. The matrix data 1018 is decomposed to generate eigenvectors 1022 and corresponding eigenvalues 1020. The eigenvector clustering circuit 1004 clusters the eigenvectors into clusters 1024. In an embodiment, the clusters are generated based on an algorithm that processes weighted eigenvalues. The clusters 1024 are input to the eigenvector centroid computation circuit 1006 that calculates eigenvector centroids. For example, an eigenvector centroid is calculated for each cluster. The eigenvector centroid computation circuit 1006 also maintains a dictionary of the eigenvector centroids.

The eigenvectors 1022 and the centroids 1026 are input to the eigenvector quantization circuit 1008 that generates tagged eigenvectors 1028. The tags associate each eigenvector with a particular eigenvector centroid. The number of eigenvectors associated with each centroid is also counted and maintained.

The tagged eigenvectors 1028 are input to the centroid PDF computation circuit 1010. The centroid PDF computation circuit 1010 counts the number of eigenvectors associated with each centroid to calculate a PDF of centroids 1030. The PDF 1030 is input to the PDF matching circuit 1012. The PDF matching circuit 1012 matches the PDF 1030 with PDF templates 1032 that are stored in the PDF database 1016. The PDF templates 1032 are associated with encoding identifiers 1034 that are also stored in the database 1016. Each identifier identifies a type of entropic encoder associated with a particular PDF template. The PDF matching circuit 1012 determines the PDF template 1032 that best matches the computed PDF 1030 and passes the corresponding encoder identifier 1036 to the encoding circuit 1014.

The encoding circuit 1014 receives the tagged (or quantized) eigenvectors 1028 and applies the selected type of encoding identified by the encoding identifier 1036 to compress the vector tags. The encoding circuit 1014 also receives the dictionary of eigenvector centroids 1040 and the eigenvalues 1020. The combination 1038, which includes the compressed vector tag data, the encoder identifier 1036, the dictionary 1040, and the eigenvalues 1020 are then transmitted to a receiving block or device that includes a decompression circuit, such as the MDDA 926. The decompression circuit decompresses the compressed data stream as described below to recover the eigenvector data.

In one aspect, the MDCA 1000 compresses matrix data for transmission by performing one or more of the following operations.

1. Perform a matrix decomposition to generate eigenvectors and corresponding eigenvalues.
2. Perform eigenvector clustering to cluster the eigenvectors into groups. An eigenvalue weighting algorithm is used to form the groups from weighted eigenvalues.
3. Perform eigenvector centroid computation to compute an eigenvector centroid for each eigenvector group. An eigenvector centroid dictionary is formed from the determined eigenvector centroids.
3. Tagging (or quantizing) each eigenvector into its corresponding centroid.
4. Performing a centroid PDF computation to construct a PDF of centroids. For example, the number of eigenvectors in each centroid are counted to construct a PDF of centroids.
5. Matching the PDF of centroids to PDF templates stored in a database. For example, the matching may be performed using KL (Kullback-Leibler) divergence or other suitable function.
6. Selecting the closest matching PDF template.
7. Determining an entropic encoder corresponding to the closest matching PDF template. For example, the entropic encoder has an associated encoder identifier that identifies the encoder.
8. Encoding the eigenvector tags with the identified entropic encoder to generate and encoded data stream.
9. Transmitting the encoded data stream, encoder identifier, the centroid dictionary, and the eigenvalues to a receiver. For example, the transmission may be one or both of a wired or wireless transmission.

Figure 11:
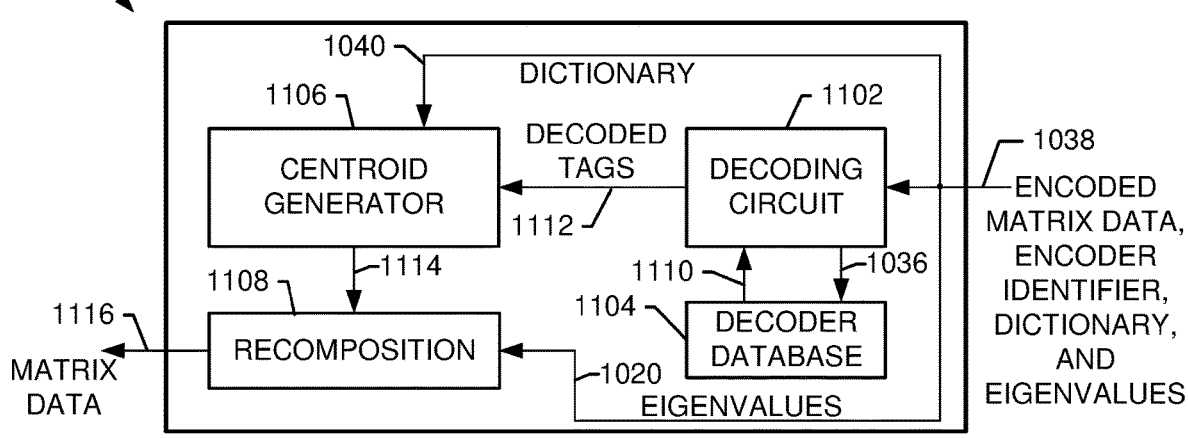
FIG. 11 shows exemplary detailed embodiment of a matrix data decompression accelerator that is configured to decompress matrix data.

FIG. 11 shows exemplary detailed embodiment of a matrix data decompression accelerator (MDDA) 1100 that is configured to decompress matrix data. For example, the MDDA 1100 is suitable for use as the MDDA 926 shown in FIG. 9B. In an embodiment, the MDDA 1100 comprises decoding circuit 1102, decoder database 1104, centroid generator 1106, and recomposition circuit 1108.

During operation, the MDDA 1100 receives the combination 1038 of the compressed data, encoder identifier 1036, dictionary 1040, and eigenvalues 1020 at the decoding circuit 1102. The decoding circuit 1102 uses the identifier 1036 to access the decoder database 1104 to obtain a decoder 1110 to be used to decompress the received compressed data. The decoder circuit 1102 decompresses the compressed tags and outputs decompressed (decoded) tag data 1112 to the centroids generator 1106. The centroid generator 1106 receives the decompressed tags 1112 and the dictionary 1040, and generates a sequence of centroids 1114 that represents the matrix data. The recomposition circuit 1108 receives the sequence of centroids 1108 and the eigenvalues 1020 and recomposes the matrix data 1116.

In one aspect, the MDDA 1100 decompresses matrix data from a transmission received from the MCDA 1000 by performing one or more of the following operations.

1. Receiving encoded tag data, encoder identifier, centroid dictionary, and eigenvalues.
2. Identifying a decoder from the encoder identifier.
3. Decoding the encoded tag data to obtain the tags.
4. Converting the tags into a sequence of centroids using the dictionary. Each tag identifies a particular centroid from the dictionary, such that a sequence of tags identifies a sequence of centroids.
5. Recomposing the matrix from the sequence of centroids and the eigenvalues.

Figure 12:
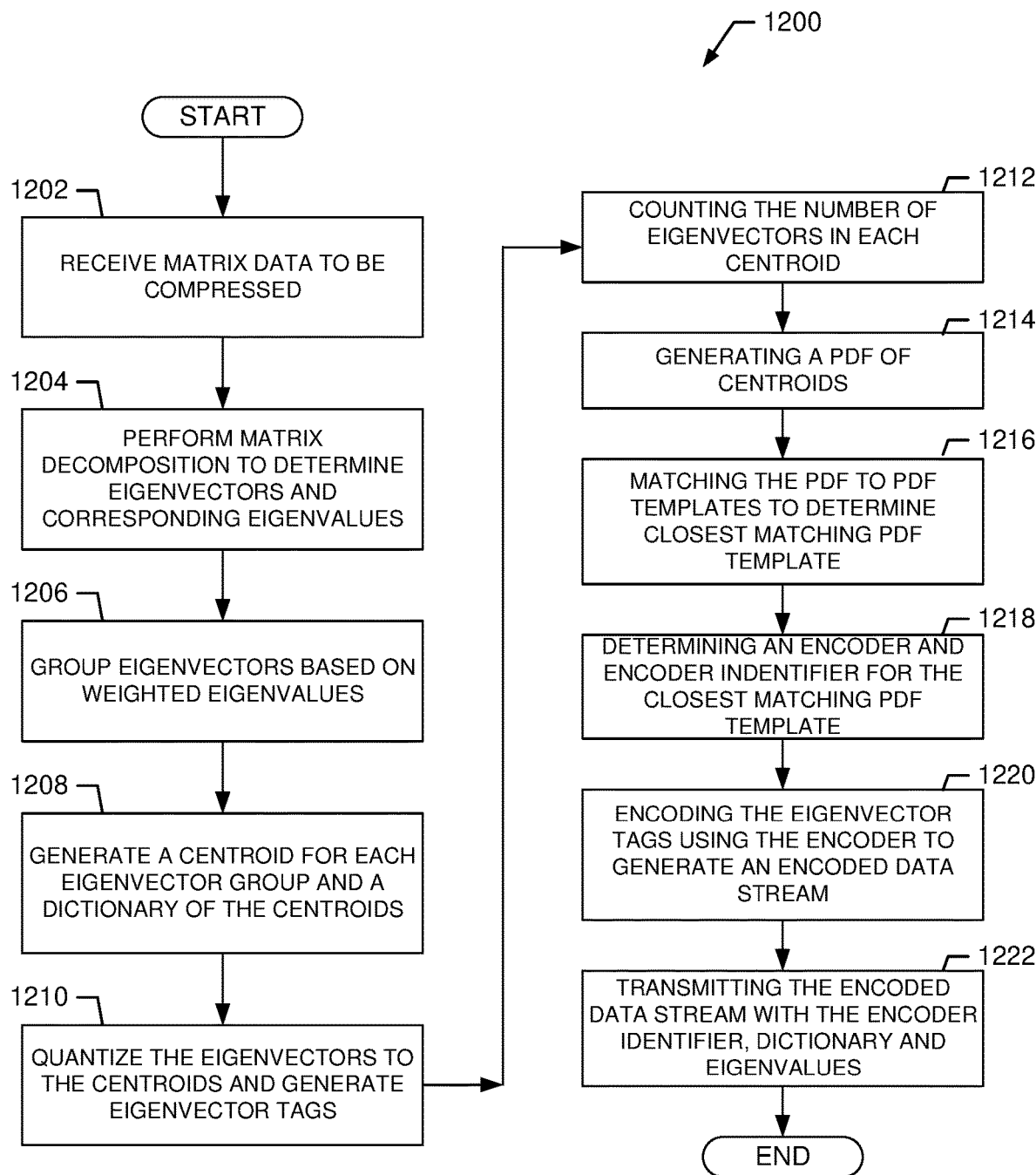
FIG. 12 shows an exemplary method for compressing matrix data.

FIG. 12 shows an exemplary method 1200 for compression of matrix data. For example, the method 1200 is suitable for use with the MDCA 1000 shown in FIG. 10.

At block 1202, matrix data to be compressed is received. For example, the matrix data 1018 is received at the decomposition circuit 1002.

At block 1204, a matrix decomposition is performed on the matrix data. In an embodiment, the matrix decomposition circuit 1002 decomposes the matrix data 1018 to generate eigenvectors 1022 and corresponding eigenvalues 1020.

At block 1206, the eigenvectors are grouped into clusters. In an embodiment, the eigenvector clustering circuit 1004, clusters the eigenvectors 1022 into groups 1024 using weighted eigenvalues 1020.

At block 1208, an eigenvector centroid for each eigenvector group is generated. Also, a dictionary of eigenvector centroids is maintained. For example, the eigenvector centroid computation circuit 1006 receives the eigenvector groups 1024 and generates a centroid for each group. The determined centroids 1026 are maintained in a dictionary that identifies each centroid and associates various parameters and values with each centroid. For example, the eigenvector centroid computation circuit 1006 forms and maintains the dictionary of centroids 1040.

At block 1210, the eigenvectors are quantized to the eigenvector centroids. For example, the eigenvector quantization circuit 1008 tags each eigenvector 1022 and quantizes the number of vectors in each centroid 1026. For example, in an aspect, quantizing the eigenvectors 1022 to the centroids 1026 is performed by tagging the eigenvectors by an index (or tag) representative of the cluster (centroid) to which the vector belongs.

At block 1212, the number of eigenvectors in each centroid are counted and output from the quantization circuit 1008 as tagged vectors 1028 that are tagged with their associated centroid.

At block 1214, a PDF of centroids is generated. For example, the centroid PDF computation circuit 1010 receives the tagged vectors 1028 and computes the PDF 1030 from the tagged vectors 1028.

At block 1216, the computed PDF is matched to PDF templates to determine the closest matching PDF template. For example, the vector PDF matching circuit 1012 matches the PDF 1030 to the PDF templates stored in the database 1016. A closest matching PDF template is determined. Each PDF template has an associated identifier that associates an encoder with the template.

At block 1218, an encoder associated with the closest matching PDF template is determined. For example, the PDF matching circuit 1012 retrieves an encoder identifier 1036 associated with the closest matching PDF template that is stored in the database 1016. The encoder identifier 1036 identifies an encoder to be used to encode the eigenvector tag data.

At block 1220, the eigenvector tags are encoded (compressed) using the determined encoder to generate an encoded data stream. For example, the encoding circuit 1014 encodes the eigenvector tags with the encoder identified by the encoder identifier 1036 to generate the encoded data stream.

At block 1222, the combination 1038 of information is transmitted. In an embodiment, the combination 1038 includes the compressed tagged data, the encoder identifier 1036, the centroid dictionary 1040, and the eigenvalues 1020. The method then ends.

Thus, the method 1200 operates to compress matrix data to be transmitted over a system interconnect. It should be noted that the operations of the method 1200 are exemplary and that changes, modifications, additions, and deletions may be made within the scope of the embodiments.

Figure 13:
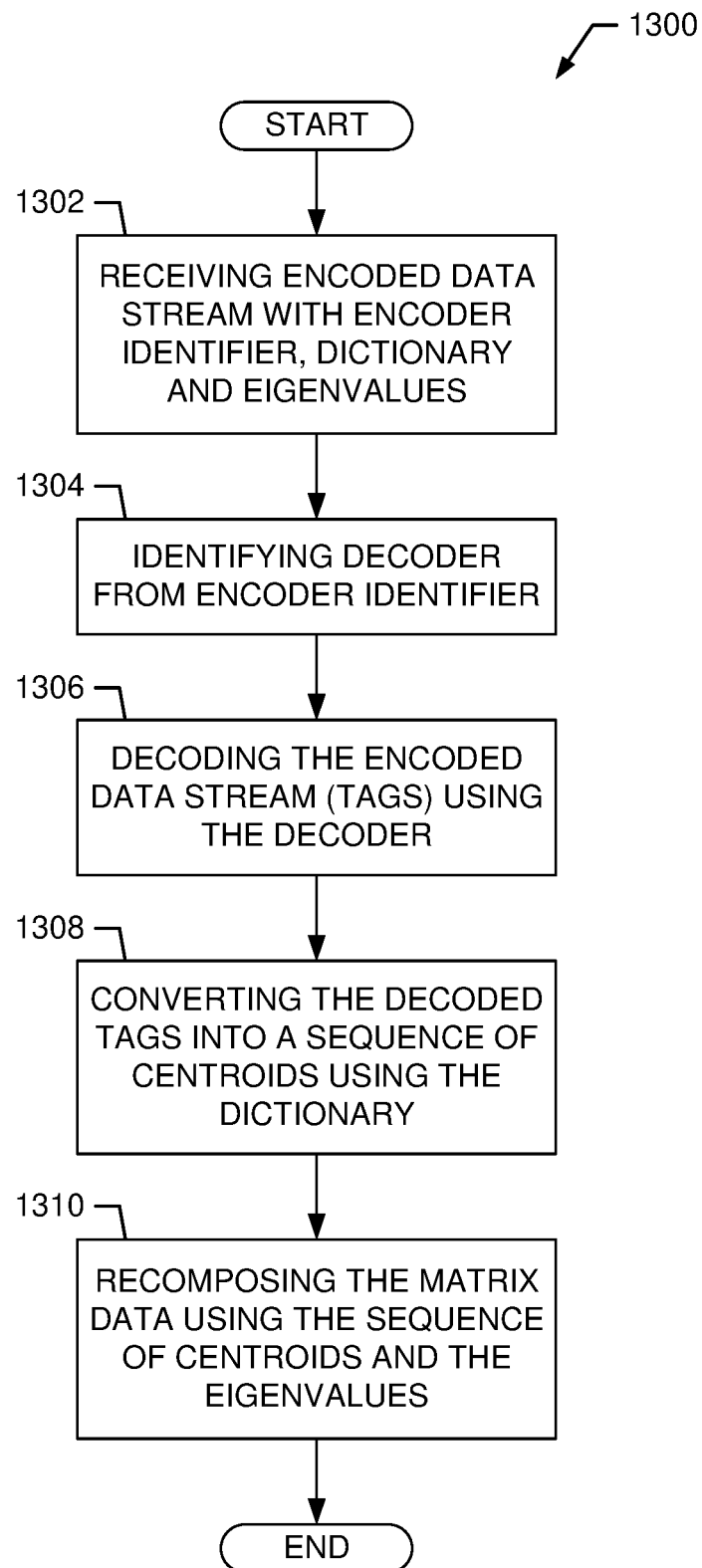
FIG. 13 shows an exemplary method for decompressing matrix data.

FIG. 13 shows an exemplary method 1300 for decompression of matrix data. For example, the method 1300 is suitable for use with the MDDA 926 shown in FIG. 9B.

At block 1302, encoded eigenvector tags with a corresponding encoder identifier, centroid dictionary, and eigenvalues are received. In an embodiment, the encoded eigenvector tags are in the form of scaler data. For example, the combination 1038 of the encoded eigenvector tags, encoder identifier 1036, dictionary 1040, and eigenvalues 1020 are received by the decoding circuit 1102.

At block 1304, a decoder is determined using the encoder identifier. For example, the decoding circuit 1102 uses the encoder identifier 1036 to access the stored decoders in decoder database 1104 to determine the decoder 1110.

At block 1306, the encoded tag data is decoded using the identified decoder. For example, the decoding circuit 1102 decodes the received encoded tag data using the decoder 1110 determined from the received encoder identifier 1036 to generate decoded tags 1112.

At block 1308, a sequence of centroids are generated from the decoded tags. For example, the centroid generator 1106 receives the decoded tags 1112 and the dictionary of centroids 1040 and generates a sequence of centroids 1114. In an embodiment, each tag is represented by a centroid from the dictionary to generate the sequence of centroids 1114.

At block 1310, the matrix data is recomposed from the sequence of centroids and the eigenvalues. For example, the recomposition circuit 1108 receives the sequence of centroids 1114 and the eigenvalues 1020 and uses these values to recompose the matrix data 1116.

Thus, the method 1300 operates to decode received compressed matrix data. It should be noted that the operations of the method 1300 are exemplary and that changes, modifications, additions, and deletions may be made within the scope of the embodiments.

Figure 14:
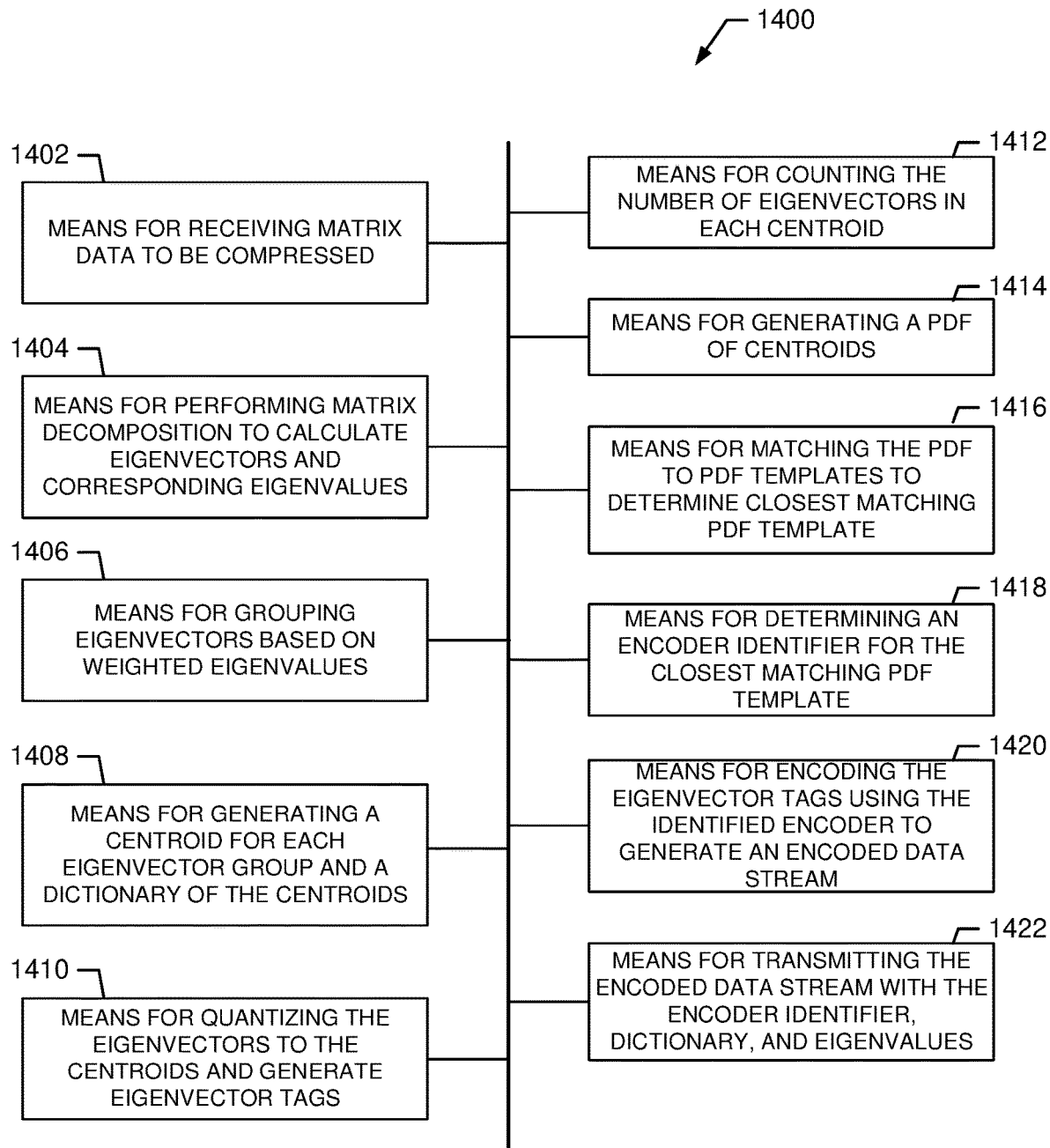
FIG. 14 shows an exemplary apparatus for compression of matrix data.

FIG. 14 shows an exemplary apparatus 1400 for compression of matrix data. For example, the apparatus 1400 is suitable for use as the MDCA 922 shown in FIG. 9B.

The apparatus comprises means (1402) for receiving matrix data for transmission, which in an embodiment comprises the decomposition circuit 1002. The apparatus also comprises means (1404) for performing matrix decomposition to calculate eigenvectors and corresponding eigenvalues, which in an embodiment comprises the decomposition circuit 1002. The apparatus also comprises means (1406) for grouping eigenvectors based on weighted eigenvalues, which in an embodiment comprises the eigenvector clustering circuit 1004. The apparatus also comprises means (1408) for generating a centroid for each eigenvector group and a dictionary of the centroids, which in an embodiment comprises the eigenvalue centroid computation circuit 1006. The apparatus also comprises means (1410) for quantizing the eigenvectors to the centroids and generating eigenvector tags, which in an embodiment comprises the eigenvector quantization circuit 1008. The apparatus also comprises means (1412) for counting the number of eigenvectors in each centroid, which in an embodiment comprises the centroid PDF computation circuit 1010. The apparatus also comprises means (1414) for generating a PDF of centroids, which in an embodiment comprises the centroid PDF computation circuit 1010. The apparatus also comprises means (1416) for matching the PDF to PDF templates to determine closest matching PDF template, which in an embodiment comprises the PDF matching circuit 1012. The apparatus also comprises means (1418) for determining an encoder identifier for the closest matching PDF template, which in an embodiment comprises the PDF matching circuit 1012. The apparatus also comprises means (1420) for encoding the eigenvector tags using the identified encoder to generate an encoded data stream, which in an embodiment comprises the encoding circuit 1014. The apparatus also comprises means (1422) for transmitting the encoded data stream with the encoder identifier, dictionary, and eigenvalues, which in an embodiment comprises the encoding circuit 1014.

Figure 15:
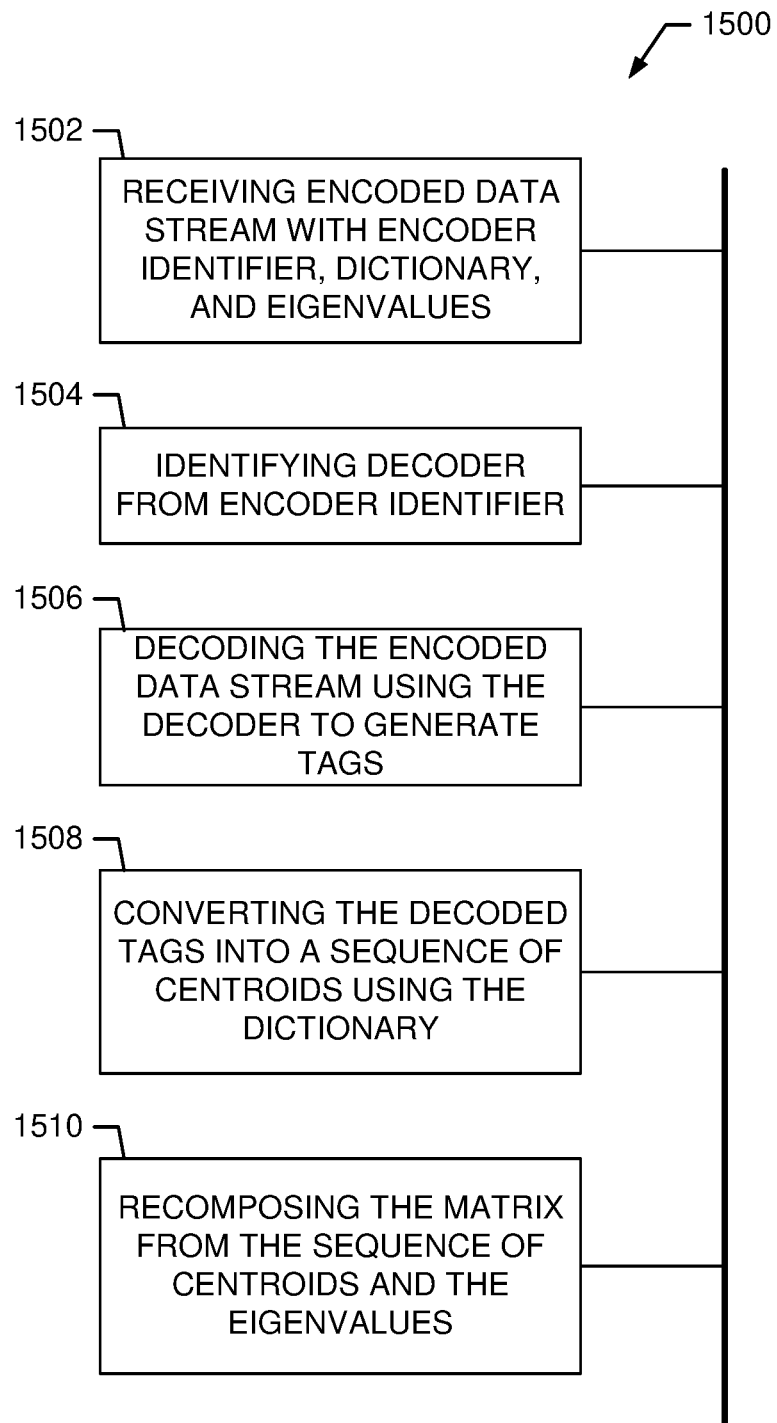
FIG. 15 shows an exemplary apparatus for decompression of matrix data.

FIG. 15 shows an exemplary apparatus 1500 for decompression of matrix data. For example, the apparatus 1500 is suitable for use as the MDDA 926 shown in FIG. 9B.

The apparatus 1500 comprises means (1502) for receiving encoded data stream with encoder identifier, dictionary, and eigenvalues, which in an embodiment comprises the decoding circuit 1102. The apparatus also comprises means (1504) for identifying a decoder from encoder identifier, which in an embodiment comprises the decoding circuit 1102 accessing the decoder database 1104. The apparatus also comprises means (1506) for decoding the encoded data stream using the decoder to generate tags, which in an embodiment comprises the decoding circuit 1102. The apparatus also comprises means (1508) for converting the decoded tags into a sequence of centroids using the dictionary, which in an embodiment comprises the centroid generator 1106. The apparatus also comprises means (1510) for recomposing the matrix from the sequence of centroids and the eigenvalues, which in an embodiment comprises the recomposition circuit 1108.

While particular embodiments of the present invention have been shown and described, it will be obvious to those skilled in the art that, based upon the teachings herein, changes and modifications may be made without departing from these exemplary embodiments of the present invention and its broader aspects. Therefore, the appended claims are intended to encompass within their scope all such changes and modifications as are within the true spirit and scope of these exemplary embodiments of the present invention.

What is claimed is:

1. A method for transmitting information utilizing compressing and decompressing data via a communication network comprising:
   forwarding a data stream to a vector centroid computation circuit for providing centroids in accordance with the data stream;
   generating a dictionary of centroids in accordance with the centroids and quantizing vectors with its corresponding centroids;
   identifying an entropic encoder in response to a closest matching probability distribution function ("PDF") template and the quantizing vectors; and
   transmitting a compressed data stream encoded by the entropic encoder, encoding identifier indicating the entropic encoder, and the dictionary of centroids to a receiver via a communication network.

2. The method of claim 1, further comprising applying an auto-encoder to the vector data to reduce a dimension of a vector data.

3. The method of claim 1, further comprising identifying a number of vectors associated with each centroid to obtain a PDF of centroids.

4. The method of claim 3, further comprising matching the PDF of centroids with a plurality of PDF templates stored in a local storage and identifying a closest match between a PDF template and the PDF of centroids.

5. The method of claim 4, further comprising identifying an encoder identifier which is associated to the closest matched PDF template.

6. The method of claim 1, further comprising transmitting an encoder identifier from a transmitter to the receiver.

7. The method of claim 1, further comprising receiving the compressed data stream and dictionary of centroids from a transmitter.

8. The method of claim 7, further comprising obtaining a decoder from a decoder database in accordance with an encoder identifier.

9. The method of claim 8, further comprising generating decompressed data via decompressing the compressed data stream via the decoder and the dictionary of centroids.

10. The method of claim 9, further comprising converting the compressed data stream to vector representation.

11. The method of claim 10, further comprising decoding the vector representation via an auto-encoder to restore dimensionality of vector data.

12. The method of claim 1, wherein transmitting the compressed data stream includes transporting the compressed data stream to the receiver over a wireless communication network.

13. A method for transmitting information utilizing compressing and decompressing data via a communication network comprising:
   receiving a compressed data, a dictionary of centroids, and an encoder identifier corresponding the compressed data from a transmitter;
   determining a decoder from a decoder database in accordance with the encoder identifier;
   generating decompressed data by the decoder in response to the compressed data and the dictionary of centroids;
   converting the decompressed data to decompressed vector data with vector representation; and
   outputting the decompressed vector data.

14. The method of claim 13, further comprising decoding the vector representation via an auto-encoder to restore dimensionality of vector data.

15. The method of claim 13, further comprising forwarding a data stream to a vector centroid computation circuit for providing centroids in accordance with the data stream when the data stream includes at least a portion of vector data.

16. The method of claim 15, further comprising generating a dictionary of centroids in accordance with the centroids and quantizing vectors with its corresponding centroids.

17. The method of claim 16, further comprising identifying an entropic encoder based on a matching probability distribution function ("PDF") template in accordance with the quantizing vectors.

18. The method of claim 13, further comprising transmitting a compressed data by the entropic encoder and the dictionary of centroids via a wireless communication network.

19. The method of claim 13, further comprising identifying a number of vectors associated with each centroid to obtain a PDF of centroids.

20. The method of claim 19, further comprising matching the PDF of centroids with a plurality of PDF templates stored in a local storage and identifying a closest match between a PDF template and the PDF of centroids.

21. The method of claim 20, further comprising identifying an encoder identifier which is associated to the closest matched PDF template.

22. An apparatus for transmitting information utilizing compressing and decompressing data via a communication network comprising:
a vector centroid computation ("VCC") circuit configured to provide centroids based on a data stream, the vector centroid computation circuit operable to generate a dictionary of centroids in accordance with the centroids and provide tagged vectors with its corresponding centroids;
a centroid probability distribution function ("PDF") computation circuit coupled to the VCC circuit and configured to calculate a PDF of centroids in response to the tagged vectors;
a PDF matching circuit coupled to the centroid PDF computation circuit and determines a PDF template that best matches the PDF of centroids; and
a vector encoding circuit coupled to the PDF matching circuit and capable of compressing the tagged vectors via an encoder based on an encoding identifier, wherein the vector encoding circuit is configured to transmit the compressed tagged vectors and the encoding identifier to a receiver via a communication network.

23. The apparatus of claim 22, further comprising an auto-encoder coupled to the VCC circuit and configured to reduce a dimension of vector data.

24. The apparatus of claim 22, wherein the centroid PDF computation circuit is able to count a number of vectors associated with each centroid for identifying the PDF of centroids.

25. The apparatus of claim 24, wherein the PDF matching circuit is configured to match the PDF of centroids with a plurality of PDF templates stored in a local storage and identifying a closest match between a PDF template and the PDF of centroids.

26. The apparatus of claim 25, wherein the vector encoding circuit is able to identify an encoder identifier which is associated to the closest matched PDF template.

27. An apparatus for transmitting information utilizing compressing and decompressing data via a communication network comprising:
means for forwarding a data stream to a vector centroid computation circuit for providing centroids in accordance with the data stream;
means for generating a dictionary of centroids in accordance with the centroids and quantizing vectors with its corresponding centroids;
means for identifying an entropic encoder in response to a closest matching probability distribution function ("PDF") template and the quantizing vectors; and
means transmitting a compressed data stream encoded by the entropic encoder, encoding identifier indicating the entropic encoder, and the dictionary of centroids to a receiver via a communication network.

28. The apparatus of claim 27, further comprising means for applying an auto-encoder to the vector data to reduce a dimension of vector data.

29. The apparatus of claim 27, further comprising means for identifying a number of vectors associated with each centroid to obtain a PDF of centroids.

30. The apparatus of claim 29, further comprising means for matching the PDF of centroids with a plurality of PDF templates stored in a local storage and identifying a closest match between a PDF template and the PDF of centroids.

31. The apparatus of claim 30, further comprising means for identifying an encoder identifier which is associated to the closest matched PDF template.

* * * * *